United States Patent [19]

Wieder

[11] 4,300,279
[45] Nov. 17, 1981

[54] METHOD FOR THE MANUFACTURE OF A MONOLITHIC, STATIC MEMORY CELL

[75] Inventor: Armin Wieder, Gauting, Fed. Rep. of Germany

[73] Assignee: Siemens Aktiengesellschaft, Berlin & Munich, Fed. Rep. of Germany

[21] Appl. No.: 169,528

[22] Filed: Jul. 16, 1980

[30] Foreign Application Priority Data

Aug. 31, 1979 [DE] Fed. Rep. of Germany ....... 2935254

[51] Int. Cl.³ ............................................. H01L 21/90
[52] U.S. Cl. .................................... 29/571; 29/577 R
[58] Field of Search ...................... 29/571, 580, 577 R; 148/1.5

[56] References Cited

U.S. PATENT DOCUMENTS

| 4,031,608 | 6/1977 | Togei et al. | 29/571 |
| 4,152,823 | 5/1979 | Hall | 29/571 |
| 4,157,269 | 6/1979 | Ning et al. | 29/577 R |
| 4,173,819 | 11/1979 | Kinoshita | 29/571 |

OTHER PUBLICATIONS

Coburn et al., "Some Chemical Aspects of the Fluorocarbon Plasma Etching of Silicon and its Compounds," Solid State Technology, (see AT).
Kroger et al., "Steady-State Characteristics of Two Terminal Inversion-Controlled Switches," Solid State Electronics, 1978, vol. 21, pp.643-654.

*Primary Examiner*—Donald L. Walton
*Attorney, Agent, or Firm*—Hill, Van Santen, Steadman, Chiara & Simpson

[57] ABSTRACT

Production of high bit density memory cells using six selective, vertically aligned, reactive plasma etching steps. A gate oxide layer is applied to the boundary surface of the semiconductor layer and has a polysilicon layer which is highly doped and covered with a first intermediate oxide layer. A drive line and the gate are first formed. Sections of the drive line at the ends thereof are removed by isotropic etching and the resulting recesses are filled in a thermal oxidation step. The portion of the gate oxide layer adjacent the structured parts is removed by a second etching step. A second polysilicon layer is deposited, highly doped and covered with a second intermediate oxide layer. Another drive line having a part contacting a doped region in the semiconductor layer, the region being formed by ion implantation, is structured by a third etching step. A recess is then formed by a fourth etching step and an isotropic etching step is performed to remove those parts of the drive line which extend to the last-mentioned recess. A fifth etching step is performed for removing the oxide layer covering the boundary surface of the semiconductor layer within the recess. A third, silicon layer is deposited and covered with a third intermediate oxide layer. Another recess is formed in the third intermediate oxide layer above the recess provided by the fourth etching in a sixth etching step. A conductive coating is then applied to the third polysilicon layer and is provided with an electrical terminal.

19 Claims, 15 Drawing Figures

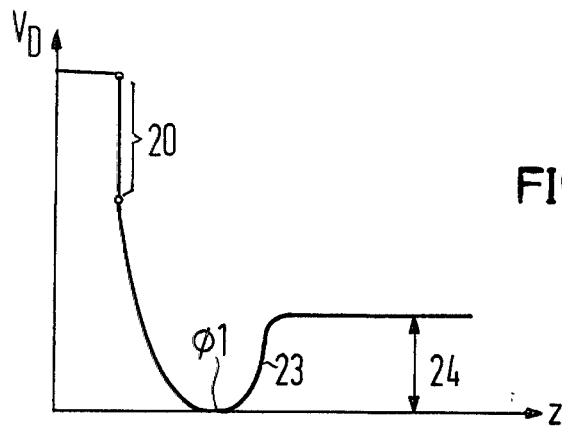
FIG 4
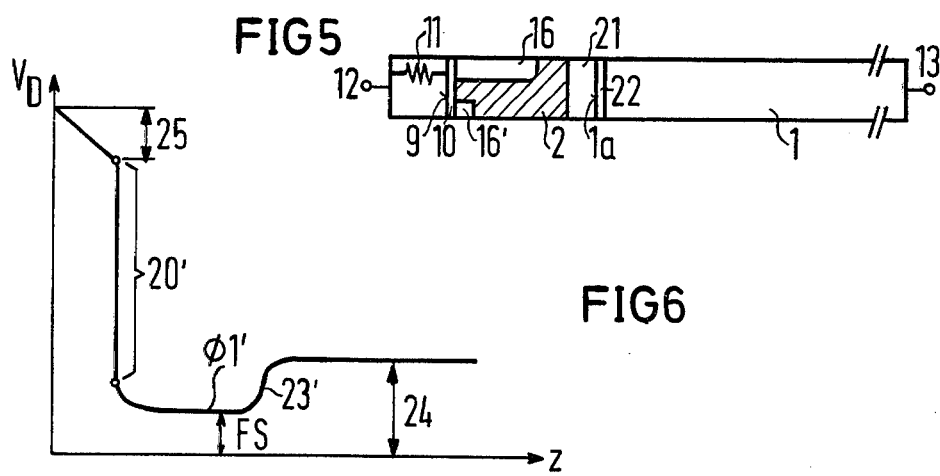
FIG 5
FIG 6
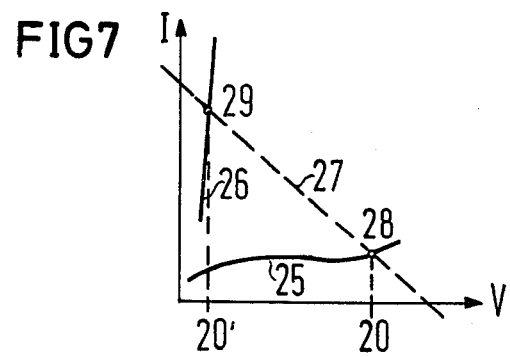
FIG 7

METHOD FOR THE MANUFACTURE OF A MONOLITHIC, STATIC MEMORY CELL

BACKGROUND OF THE INVENTION

Field of the Invention

The present invention relates to a method for the manufacture of a monolithic, static memory cell in which a semiconductor layer of a second conductivity type is arranged on a semiconductor body of a first conductivity type which is provided with a first terminal, in which a region of the first conductivity type is provided at a boundary surface of the semiconductor layer, the region being connected to a first drive line, and in which a first zone of the semiconductor layer adjacent to the region is covered by a gate connected to a second drive line, the gate being separate from the boundary surface by a gate insulator, in which a second zone of the semiconductor layer adjacent to the first zone is covered by a conductive coating connected to a second terminal, and in which the conductive coating is separated from the boundary surface by a thin electrically insulating layer which admits a tunnel current between the boundary surface and the conductive coating.

SUMMARY OF THE INVENTION

The object of the present invention is to provide a method of the type generally set forth above with which superintegratable memory cells can be realized.

This object is achieved in that the semiconductor layer is provided with strip-shaped insulation zones extending up to the semiconductor body and limiting the memory cell. A gate oxide layer is applied to the boundary surface of the semiconductor layer and has a polysilicon layer deposited thereon which is highly doped and covered with a first intermediate oxide layer. The second drive line and the gate are structured by a first, selective, vertically aligned, reactive plasma etching. Those sections of the second drive line lying at the ends are removed in an isotropic etching step and the recesses thereby formed are filled in a thermal oxidation step. That part of the gate oxide layer adjacent to the structured parts is removed by a second, selective, vertically aligned, reactive plasma etching. A second polysilicon layer is deposited, highly doped and covered with a second intermediate oxide layer. The first drive line, including the part contacting the region, is structured by a third, selective, vertically aligned, reactive plasma etching and the region is doped by ion implantation. A fourth, vertically aligned, reactive plasma etching is performed for the formation of a recess, followed by an isotropic etching for the removal of those parts of the first and second drive lines discharging into the recess and a thermal oxidation for filling the recesses. A fifth, selective, vertically aligned, reactive plasma etching is performed for the removal of the oxide layer covering the boundary surface within the recess. A third polysilicon layer is deposited and covered with a third intermediate oxide layer. A recess is formed in the third intermediate oxide layer with a sixth selective, reactive plasma etching, and a conductive coating is applied to the third polysilicon layer within the recess and is provided with a second terminal.

The advantage which is achieved in practicing the present invention can be seen, in particular, in that the finished, static memory cells require only an extremely small semiconductor surface which, in particular, is to be attributed to the fact that the method steps required for its manufacture are self-adjusting. In conjunction with the low space requirement of the memory cells, a high bit density is achieved given static memory modules.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 4 is a graphic illustration of a potential curve belonging to FIGS. 2 and 5;

FIG. 5 is a schematic cross-sectional view of a memory cell in which the potential curve according to FIG. 4 and FIG. 6 occurs;

FIG. 6 is a graphic illustration of a potential curve belonging to FIGS. 3 and 5;

FIG. 7 is a graphic illustration of an operational diagram according to a portion of FIG. 1;

DESCRIPTION OF THE PREFERRED EMBODIMENTS

The Element and Its Operation

Figure 1:
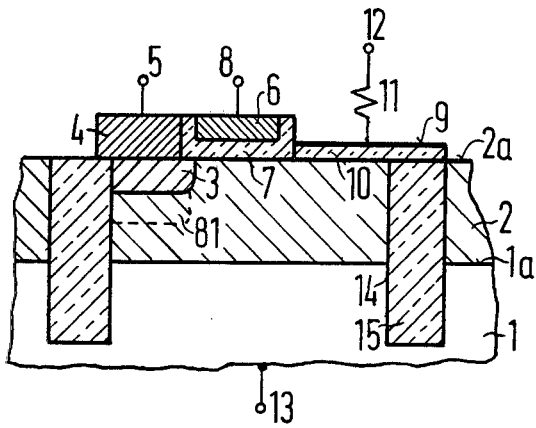
FIG. 1 is a schematic cross-sectional view of a static memory cell constructed in accordance with the present invention.

The memory cell according to FIG. 1 is constructed on a doped semiconductor body 1, for example consisting of n-conductive silicon, which is covered with a semiconductor layer 2 of opposite conductivity, for example consisting of p-conductive silicon. At the boundary surface 2a of the semiconductor layer, there is located a region 3 oppositely doped with respect to the layer which, in the present example is then n-conductive. A first drive line (bit line) 4, illustrated as a conductive coating, and having a terminal 5, contacts the region 3. A gate 6 is arranged adjacent to the region 3, the gate 6 being separated from the boundary surface 2a by means of a gate insulator 7 and being electrically insulated with respect to the adjacent circuit portions in the lateral direction as well as by means of lateral portions of the layer representing the gate insulator which, for example, consists of SiO₂. The gate 6 represents a portion of a second drive line (word line) which has an end terminal 8, or which is connected to a word line by way of the terminal 8. An electrically conductive coating 9 is provided adjacent the gate 6, the coating 9 being separated from the surface 2a by a very thin electrically insulating layer 10 consisting, for example, of $SiO_2$. Thereby, the thickness of the layer 10 is selected in such a manner that it admits a tunnel current between the boundary surface 2a and the conductive coating 9. The latter is connected by way of a load element, symbolized by a resistor 11, to a terminal 12 which is connected to a voltage $V_D$. The semiconductor body 1 is provided with a terminal 13 to which a voltage $V_{Sub}$ is applied. The memory cell is surrounded by a trough-like recess 14 which extends from the boundary surface 2a into the semiconductor body 1 and is filled with an electrically insulating material, in particular an oxide layer 15. The circuit portion 14, 15, can also be replaced by a semiconductor zone extending in the vertical direction from the boundary surface 2a down to the boundary surface 1a and corresponding in its lateral direction approximately to the dimensions of the recess 14, the semiconductor zone having a conductivity which corresponds to that of the semiconductor body 1, here n-conductivity.

Figure 2:
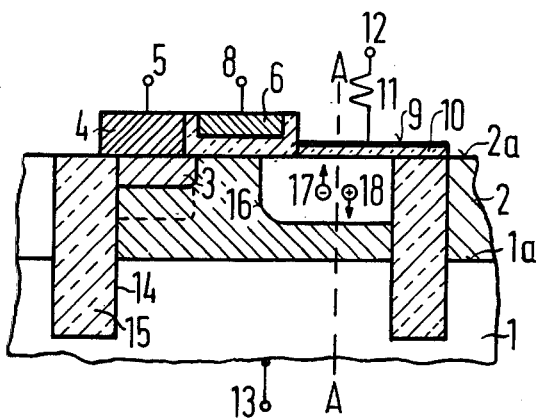
FIG. 2 is a schematic cross-sectional view of a first operating state of the memory cell of FIG. 1.

FIG. 2, first, shows a first operating state of the memory cells schematically illustrated in FIG. 1. The voltage $V_D$ constantly supplied to the terminal 12 effects the build-up of a depletion zone 16 beneath the conductive coating 9. The negative charge carriers 17 thermally generated in the zone 16 move, under the influence of the electric field prevailing in the zone 16, to the boundary surface 2a, whereas the positive charge carriers 18 are transported to the terminal 13. The very thin insulating layer 10 allows the passage of the negative charge carrier 17 which are then, in turn, supplied to the terminal 12, so that a generation current traceable to the charge carriers 17 and 18 flows between the terminals 12 and 13.

Figure 3:
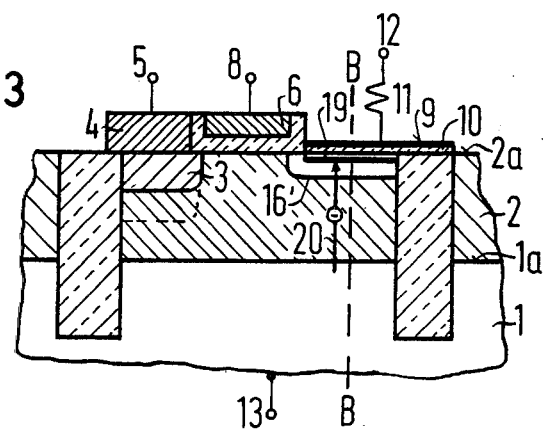
FIG. 3 is a schematic cross-sectional view of a second operating state of the memory cell of FIG. 1.

The operating state illustrated in FIG. 3 differs from that according to FIG. 2 in that an inversion layer or, respectively, inversion charge 19 is situated at the boundary surface 2a beneath the conductive coating 9, the depletion zone 16 being reduced under the influence of the inversion layer or, respectively, inversion charge 19. The elements 19, 2 and 1 represent a bipolar transistor whose emitter zone is formed by the semiconductor body 1 and whose base region is formed by the semiconductor layer 2. The collector of this transistor is represented by the inversion layer 19. Under the influence of the voltage $V_D$, an injection current consisting of negative charge carriers and indicated by the arrow 20 occurs, the negative charge carriers being injected from the semiconductor body 1 by way of the boundary surface 1a into the layer 2 and arriving at the inversion collector 19. A significantly greater tunnel current arises through the insulating layer 10 than in the operating state according to FIG. 2, whereby the negative charge carriers again arrive at the terminal 12. Therefore, an injection current whose magnitude is determined by the tunnel current exists between the terminals 12 and 13.

FIG. 4 illustrates a potential curve $\phi$ which occurs along the line A—A of FIG. 2; while FIG. 5, in its upper portion, illustrates a section through the arrangement according to FIG. 2 which extends perpendicularly to the plane of the drawing of FIG. 2 and contains the line A—A. The circuit portions 1, 2 and 9-13 of FIG. 5 have already been described on the basis of FIGS. 1 and 2. The potential curve $\phi$ of FIG. 4 over a distance Z from the upper end of the load element 11 reveals that the small generation current effects a very small potential drop at the load element 11. The potential drop occurring at the insulation layer 10 is referenced 20. The potential $\phi$ decreases in the depletion zone 16 to the potential $\phi1$ of the semiconductor layer 2, whereas there is a potential rise 23 in the depletion zone 21 which is constructed, together with the depletion zone 22, at the boundary plane 1a, the potential rise 23 being approximately equal to a value 24 which corresponds to the potential of the semiconductor body 1.

FIG. 6 illustrates the potential course $\phi$ along a line B—B of FIG. 3, that is generally in the same area as justdiscussed, but in a different operating state and in a diagrammatic form corresponding to that of FIG. 4, whereby a smaller depletion zone 16' is now to be taken into consideration, which is indicated in FIG. 5. A significantly greater injection current produces a voltage drop 25 at the load element 11, an increase voltage drop 20' at the insulation layer 10, a reduced voltage drop within the depletion zone 16' to the value $\phi1'$ of the layer 2 now increased by some forward bias FS, and a reduced potential rise 23' to approximately the value 24 which again corresponds to the potential of the semiconductor body 1.

FIG. 7 illustrates the current/voltage characteristic of a bistable element comprising the elements 2, 16, 10 and 9. In this diagram, the current I flowing through the element is indicated over the voltage V applied to the elements 2 and 9. The characteristic curve has two branches 25 and 26 which, together with a resistance line 27 corresponding to the load element 11, produce two intersection points 28 and 29. Each of these points of intersection represents a stable working point of the bistable element.

The bistable element 10, 9, 16 and 2, together with the load element 11 and the semiconductor body 1, forms a partial circuit which is operated in two stable switching states defined by the working points 28 and 29, whereby the selection between the working points 28 and 29 occurs due to the magnitude of the current flowing between the terminals 12 and 13. If no inversion charge 19 exists (FIG. 2), then a small generation current flows which, by way of the characteristic curve of FIG. 7, effects an adjustment to the voltage 20 at the insulation layer 10 or, respectively, to the working point 28. Given an existing inversion charge in accordance with FIG. 3, the working point 29 is set by means of the existing, high injection current which allows a voltage drop 20' by way of the insulation layer 10. Thereby, the injection current prevents a decomposition of the inversion charge 19 whereas, in the first case, the small tunnel current corresponding to the generation current prevents the build-up of an undesired inversion charge at the boundary surface 2a below the conductive coating 9.

An arrangement corresponding to the elements 1, 2, 9, 10, 11 and 12 is described in the publication "Solid State Electronics" 1978, Vol. 21, pp. 643–654.

The memory element is now operated in such a manner that, for writing a first digital information which, for example, is provided as a logical "0", the bit line 4 has a high potential $V_0$ applied thereto by way of the terminal 5. The word line 6 is connected to a gate voltage $V_G$ via the terminal 8, the gate voltage $V_G$ inverting the semiconductor layer beneath the gate 6 and resulting in the build-up of the transfer channel at the boundary surface 2a. The voltage $V_D$ applied to the terminal 12 generates a surface potential at the boundary surface 2a below the coating 9, the surface potential being smaller than the potential of the region 3 connected to the bit line 4. Therefore, no charge carriers are transported out of the region 3 to the boundary surface 2a beneath the insulation layer 10 and no inversion charge is formed at that location. By so doing, the operating state described on the basis of FIG. 2 arises in which a small generation current flows and the working point 28 is set. After inscription of the digital information, the potential $V_G$ is switched off and the bit line 4 is thus separated from the memory element.

For writing the second digital information which, for example, is given by a logical "1", the bit line 4 is connected by way of the terminal 5 to a low voltage $V_1$. The gate voltage $V_G$ generating a transfer channel is again applied to the terminal 8. In this mode, charge carriers are injected out of the region 3 into the semiconductor layer 2 and collect under the conductive coating 9, connected to the potential $V_D$, in the form of an inversion charge. There follows the operating state according to FIG. 3 in which a large injection current flows which corresponds to the working point 29. By means of this injection current, the inversion charge is maintained after the disconnection of the potential $V_G$ or, respectively, the disconnection of the bit line 4 from the memory element.

The stored digital information which is derived from the presence or absence of the inversion charge 19 is now maintained by the respective stationary working point 28 or 29 without requiring periodic regeneration.

For reading the stored information, the bit line 4 is first reset to a reference potential and is subsequently disconnected from external potentials so that it is situated in a "floating" state. Subsequently, the gate 6 is again charged with the gate voltage $V_G$. Differing potential changes which arise on the bit line 4 as a function of the presence or absence of an inversion charge 19 are evaluated as read-out signals for various stored digital information in that they are supplied to the gate of an input field effect transistor of an evaluation stage (read amplifier) and influence the current flowing through the stage whose voltage drop arising at a load element can be used as the basis for further logical processing. Advantageously, the bit line 4 is reset to a high reference potential for the purpose of reading, so that, upon reading of a logical "1", a noticeable voltage drop occurs on the bit line 4 due to the charge carriers penetrating into the region 3, whereas, upon reading a logical "0", the reset potential is retained on the bit line 4 due to the lack of an inversion charge 19.

The Method of Manufacture

Figure 8:
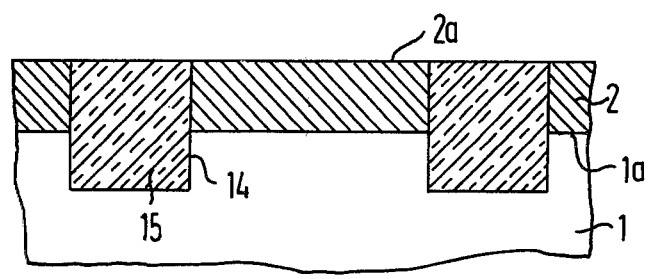
FIGS. 8–12 illustrate, in cross-section, individual intermediate stages of the memory cell during the manufacturing process of the present invention.
Figure 9:
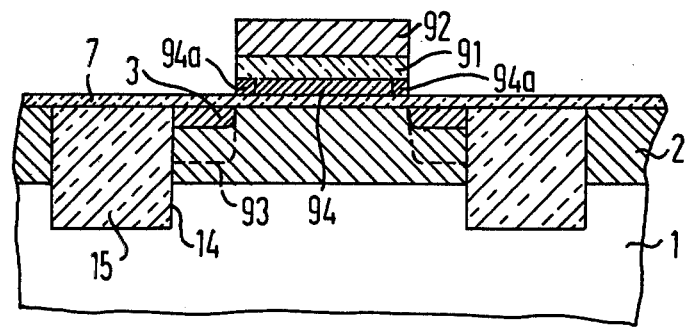
Figure 10:
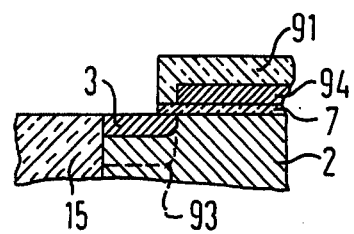
Figure 11:
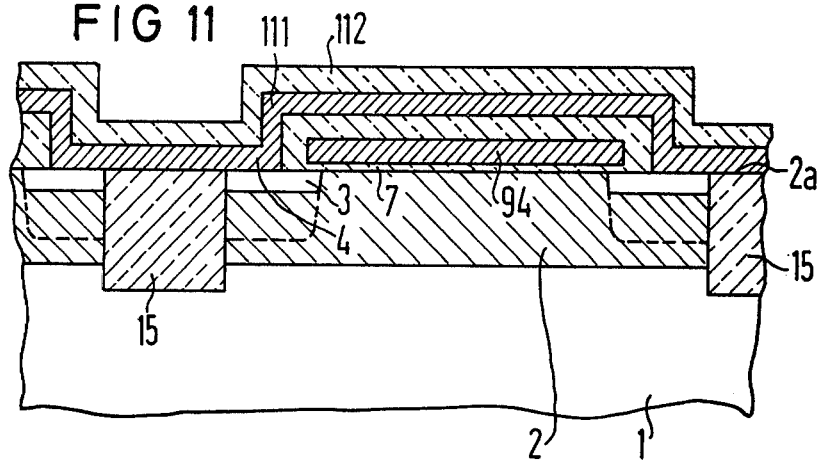
Figure 14:
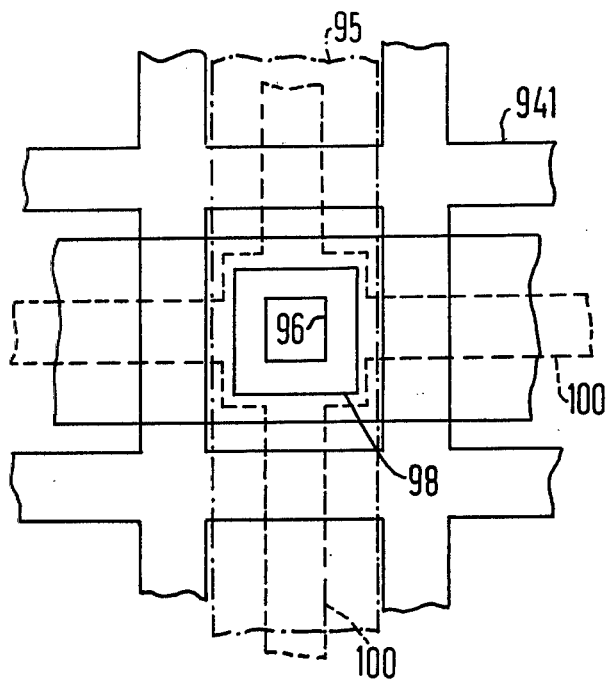
FIG. 14 is an illustration of the masks which are required for the individual manufacturing step.

In the manufacture of a memory cell according to the present invention, and as illustrated in FIG. 8, one proceeds from a conductor body 1 on which a semiconductor layer is arranged. The semiconductor body 1 consists, for example, of n-conductive silicon with a doping concentration of $10^{19}$ cm$^{-3}$, whereby the semiconductor layer 2 consists of p-conductive silicon which has a doping concentration of approximately $5 \cdot 10^{15}$ cm$^{-3}$. Defined, trough-like recesses 14 are provided in this structure by a first mask 941 (FIG. 14), this preferably occurring with a selective, vertically aligned, reactive plasma etching step. The recesses 14 are subsequently filled with an insulated material 15, for example with SiO$_2$ in the course of a thermal oxidation, whereby the material projecting beyond the boundary surface 2a is again removed, for example by means of a further etching operation. An oxidation step for the application of a SiO$_2$ gate oxide layer 7 (FIG. 9) follows. Subsequently, a polycrystalline silicon layer 94 is deposited over the entire surface, the polycrystalline silicon layer being highly doped with donors and covered by an intermediate oxide layer 91 consisting of SiO$_2$. The lateral limitations of the gate 6 and the connected word line are defined by a second mask 92 consisting, for example, of photosensitive resist and are structured by a selective, vertically aligned, plasma etching step. Before removal of the second mask 92, an implantation of donor ions occurs, for example arsenic, in order to form the n-conductive region 3 and, under certain conditions, an implantation of acceptor ions in order to increase the doping of the layer 2 in a zone 93 below the region 3. In an isotropic etching step, those sections 94a of the polycrystalline silicon layer 94 at the end sides are subsequently etched out and are filled with SiO$_2$ in a thermal oxidation step. The gate oxide layer 7 is then removed in a vertically aligned, reactive plasma etching step, whereby a structure according to FIG. 10 arises.

Figure 12:
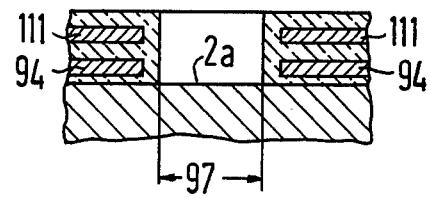

Then, a further deposition of a polycrystalline silicon layer 111 is carried out, the layer 111 being strongly doped with donors and subsequently covered with an intermediate oxide layer 112 of, for example, SiO$_2$. By a selective, vertically aligned, reactive plasma etching step, the first drive line including the portion 4 contacting the region 3 is structured through a third mask 95. Following this, a reactive plasma etching step is performed in which the portions of the polycrystalline silicon layers 94 and 111 lying within the opening 97 (FIG. 12) of a fourth mask 96 as well as the intermediate oxide layers and the gate oxide layer 7 are removed up to the boundary surface 2a. In a subsequent, isotropic etching step, those sections of the strip-like polycrystalline silicon layers 94 and 111 at the insides extending into the opening 97 are removed and the recesses occurring are filled with SiO$_2$ in a thermal oxidation step. The SiO$_2$ formed within the opening 97 on the boundary surface 2a is then removed in a vertically aligned, reactive plasma etching step. A partial structure according to FIG. 12 therefore arises.

Figure 13:
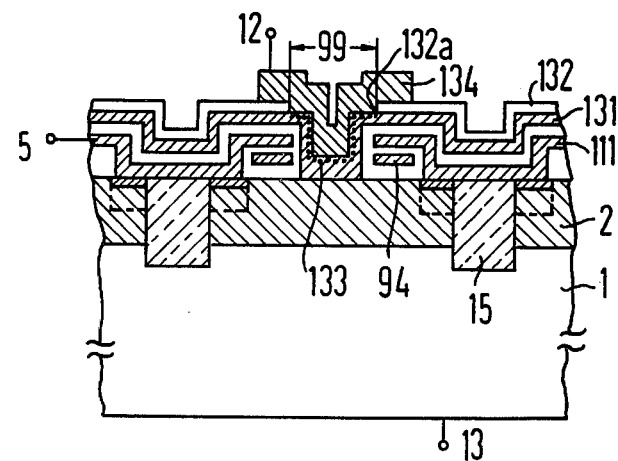
FIG. 13 is a cross-sectional view through a portion of a memory cell manufactured in accordance with the method of the present invention.

A further deposition of a layer 131 (FIG. 13) of polycrystalline silicon which is, at first, not doped, is then performed. The layer 131 is covered with an intermediate oxide layer 132. A fifth mask 98 is applied thereto and includes an opening 99 which can be somewhat larger than the opening 97. The portion of the intermediate oxide layer 132 which lies within the opening 99 is removed by reactive plasma etching. A weak implantation of donor ions, for example arsenic ions, is then performed into the surface of the layer 131, namely only within the opening 99. The influenced surface of the layer 131 is referenced 133 in FIG. 13. After the removal of the fifth mask, finally, a conductive coating 134 is applied, the structure thereof being implemented by a masking step (sixth mask 100). The portion 134 of the conductive coating illustrated in FIG. 13 can continue in the form of a strip either perpendicular to the drawing plane of FIG. 13 or parallel to the drawing plane. The individual masks are illustrated lying one above another in FIG. 14 and are characterized by different types of lines. The structure according to FIG. 13, which is augmented by the terminals 12, 5 and 8 (FIG. 1), then forms a static memory cell manufactured according to the present invention.

According to a variation of the method described above, the surface-side implantation of the polycrystalline silicon layer 131 with donor ions, which is referenced 133, can be eliminated.

If the weak doping 133 is carried out, then the undoped portion of the layer 131 which lies within the opening 99 represents the insulating layer 10 of FIG. 1, whose thickness lies approximately in the magnitude of 4000 A. Since the conductive coating 134 is arranged on that part of the layer 131 which lies within the opening 99, a Schottky junction is formed which represents the load element 11 (FIG. 1) and is operated in the pass-through direction in the area of the portion 133. The conductive coating 134 then forms the connection to the terminal 12.

Figure 15:
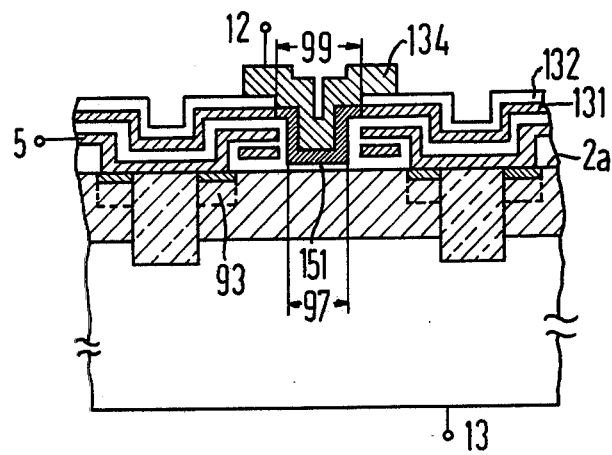
FIG. 15 is a cross-sectional view taken through a portion of the memory cell manufactured in accordance with the present invention, and in particular in which the third polysilicon layer is doped in the area of a recess by selective ion implantation.

According to another variation of the method described above, after the reactive plasma etching with which the $SiO_2$ layer is etched away from the inside of the opening 97, a thin insulating layer 151, preferably consisting of $SiO_2$, and having a layer thickness of approximately 30-60 A is first applied by means of a thermal oxidation step to the boundary surface 2a within the opening 97. The method step for applying the undoped polycrystalline silicon layer 131 and the intermediate oxide layer 132 then follows. Subsequently thereto, a fifth mask 98 is applied and that portion of the layer 132 located within the opening 99 is removed by means of a reactive plasma etching step. In contrast to the method first described, there follows an implantation of donor ions into that section of the undoped polycrystalline silicon layer 131 within the opening 99, whereby such an implantation energy is employed that this section of the layer 131 is doped up to the boundary surface with respect to the insulation layer 151. The metallically conductive layer 134 is then applied and structured by utilization of the mask 100 illustrated in FIG. 14. Finally, the terminals 12, 5 and 8 are applied. In the embodiment of the memory cell thus obtained, which is illustrated in FIG. 15, the thin insulating layer 10 of FIG. 1 is formed by the application of the $SiO_2$ layer 151. The Schottky junction also arising in this variation of the method at the boundary surface of the layers 131 and 134 represents the load element 11 (FIG. 1).

As already set forth above, the zone 93 of the semiconductor layer 2 is provided with an auxiliary doping, so that it exhibits a higher degree of doping than the remaining portions of the layer 2. This occurs in order to suppress a npn transistor action between the elements 1, 2 and 3. Thereby, charge carriers which are injected from the semiconductor body 1 into the layer 2 would arrive in the region 3 and influence the potential on the first drive line.

In a number of method steps, a selective, vertically aligned, reactive plasma etching operation occurs in which the etching agent consists of a weakly ionized gas which, above all, influences the etching specimen in a direction determined by an applied electric field. Such an etching method with which vertical edges of individual structures or recesses can be achieved is known, for example, from the essay *"Some Chemical Aspects of the Fluor Carbon Plasma Etching of Silicon and its Compounds"*, Journal of Solid State Technology, Vol. 4, pp. 117-124, 1979, and from the essay *"Anisotropic Plasma Etching of Semiconductor Materials"*, Journal of Solid State Technology, Vol. 4, pp. 125-132, 1979.

Deviating from the description pertaining to FIG. 8, a barrier layer insulation can also be employed instead of the oxide insulation of the memory cell formed by the elements 14 and 15. In this case, the element 15 represents a $n^+$-conductive region which extends up to the boundary surface 1a between the elements 1 and 2. The doping of the region 15 occurs by either diffusion or implantation.

The semiconductor layer 2 can either be an epitaxial layer which is deposited on the semiconductor body or a diffusion region of the semiconductor body.

The voltages and potentials specified above have a positive operational sign in comparison to the potential at the terminal 13 (FIG. 1) when the semiconductor body 1 is designed with n-conductive material and the semiconductor layer 2 is p-conductive material. If the conductivity types of the individual semiconductor regions are replaced by their opposites, then the voltages and potentials related to the potential at the terminal 13 have a negative operational sign.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method of manufacturing a monolithic, static memory cell in which a semiconductor body of a first conductivity type carries a semiconductor layer of a second, opposite conductivity type, in which the semiconductor layer includes a region therein at its boundary surface of the first conductivity type and a first drive line connected to the region and to a second terminal, in which a gate connected to a third terminal is separated from the semiconductor layer by an insulating layer, in which the gate is located adjacent to a first zone in the semiconductor layer, in which a conductive coating separated from the semiconductor layer by a thin insulating layer admitting a tunnel current between the boundary surface and the conductive coating is located over a second zone of the semiconductor layer, in which the conductive coating is connected to a fourth terminal, comprising the steps of:
    (a) forming boundaries defining the extent of the memory cell in the semiconductor layer;
    (b) applying a gate oxide layer on the boundary surface of the semiconductor layer;
    (c) applying a highly-doped first polycrystalline layer on the gate oxide layer.
    (d) applying a first intermediate oxide layer on the polycrystalline layer;
    (e) etching the structure to form a gate and a second drive line;
    (f) etching the ends of the second drive line to form recesses;
    (g) filling the recesses with an insulating material;
    (h) removing the gate oxide layer adjacent the structured portions;
    (i) applying a highly-doped second polycrystalline silicon layer on the first intermediate oxide layer;
    (j) applying a second intermediate insulating layer on the second polycrystalline silicon layer;
    (k) etching the first drive line contacting the region to structure the same;
    (l) ion implanting to dope the region contacting the first drive line;
    (m) etching to form a recess down to the boundary surface of the semiconductor layer;

(n) etching portions of the first and second drive lines which extend into the recess of step (m);

(o) oxidizing the bottom of and the sides of the recess of step (m) to fill the voids left in the step (n);

(p) etching the oxide formed in the bottom of the recess of step (o) to remove the same;

(q) applying a third polycrystalline layer;

(r) applying a third intermediate layer on the third polycrystalline layer;

(s) etching an aligned recess through the third polycrystalline and third intermediate insulating layers;

(t) applying a conductive coating in the aligned recesses; and (u) applying a terminal to the conductive coating.

2. The method of claim 1, wherein step (c) is defined as:

(c1) depositing the polycrystalline silicon layer.

3. The method of claim 1, wherein step (e) is defined as:

(e1) etching by a selective, vertically aligned, plasma etching process.

4. The method of claim 1, wherein step (f) is defined as:

(f1) etching by an isotropic etching process.

5. The method of claim 1, wherein step (g) is defined as:

(g1) filling the recesses by thermal oxidation.

6. The method of claim 1, wherein step (h) is defined as:

(h1) etching the gate oxide layer by a selective, vertically aligned plasma etching process.

7. The method of claim 1, wherein step (i) is further defined as:

(i1) depositing the second polycrystalline silicon layer.

8. The method of claim 1, wherein step (k) is further defined as:

(k1) selective, vertically aligned etching of the first drive line.

9. The method of claim 1, wherein step (m) is further defined as:

(m1) isotropic etching to form the recess.

10. The method of claim 1, wherein step (o) is further defined as:

(o1) thermally oxidizing the bottom and sides of the recess.

11. The method of claim 1 wherein step (n) is further defined as:

(n1) isotropic etching of the ends of the drive lines extending to the recess.

12. The method of claim 1, wherein step (p) is defined as:

(p1) performing selective, vertically aligned, plasma etching.

13. The method of claim 1, wherein step (q) is defined as:

(q1) depositing the third polycrystalline silicon layer.

14. The method of claim 1, comprising the further step of:

(v) doping the third polysilicon layer in the area of the recess of step (s).

15. The method of claim 14, wherein step (v) is defined as:

(v1) ion implanting a dopant.

16. The method of claim 14, comprising the further step of:

(w) after the step (p), applying a thin insulating layer on the boundary surface of the semiconductor layer; and the stop (v) is further defined as (v1) selectively ion implanting a dopant in the third polycrystalline layer across the entire surface to the insulating layer.

17. The method of claim 1, comprising the step of:

(v) doping a zone beneath the region connected to the first drive line more strongly than remaining regions.

18. The method of claim 1, comprising the initial step of:

(aa) epitaxially forming the semiconductor layer on the semiconductor body.

19. The method of claim 1, comprising the initial step of:

(aa) diffusing the semiconductor layer into the semiconductor body.

* * * * *